United States Patent
Sakai et al.

(10) Patent No.: US 12,261,411 B2
(45) Date of Patent: Mar. 25, 2025

(54) SEMICONDUCTOR LASER DRIVING APPARATUS, ELECTRONIC EQUIPMENT, AND MANUFACTURING METHOD OF SEMICONDUCTOR LASER DRIVING APPARATUS

(71) Applicant: SONY SEMICONDUCTOR SOLUTIONS CORPORATION, Kanagawa (JP)

(72) Inventors: Kiyohisa Sakai, Kanagawa (JP); Hirohisa Yasukawa, Kanagawa (JP); Nobuaki Kaji, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 545 days.

(21) Appl. No.: 17/636,421

(22) PCT Filed: Jul. 20, 2020

(86) PCT No.: PCT/JP2020/028047
§ 371 (c)(1),
(2) Date: Feb. 18, 2022

(87) PCT Pub. No.: WO2021/039199
PCT Pub. Date: Mar. 4, 2021

(65) Prior Publication Data
US 2022/0294179 A1 Sep. 15, 2022

(30) Foreign Application Priority Data
Aug. 30, 2019 (JP) .................................. 2019-157724

(51) Int. Cl.
*H01S 5/0225* (2021.01)
*H01S 5/00* (2006.01)
(Continued)

(52) U.S. Cl.
CPC .......... *H01S 5/0225* (2021.01); *H01S 5/0014* (2013.01); *H01S 5/02218* (2021.01);
(Continued)

(58) Field of Classification Search
CPC ........................... H01S 5/02218; H01S 5/0225
See application file for complete search history.

(56) References Cited

U.S. PATENT DOCUMENTS

| 8,649,833 B1 | 2/2014 | Lee |
| 10,069,275 B1 | 9/2018 | Lee et al. |

(Continued)

FOREIGN PATENT DOCUMENTS

| JP | 2009-170675 | 7/2009 |
| JP | 2013-168586 | 8/2013 |

(Continued)

OTHER PUBLICATIONS

International Search Report prepared by the Japan Patent Office on Oct. 5, 2020, for International Application No. PCT/JP2020/028047, 3 pgs.
(Continued)

*Primary Examiner* — Tuan N Nguyen
(74) *Attorney, Agent, or Firm* — Sheridan Ross PC

(57) ABSTRACT

An object of the present technique is to improve safety in a semiconductor laser driving apparatus that diffuses laser light by a diffusion plate. A substrate incorporates a laser driver, and a semiconductor laser is mounted on one surface of the substrate. Connection wiring electrically connects the laser driver and the semiconductor laser to each other with a wiring inductance of 0.5 nanohenries or less. A diffusion plate diffuses laser light irradiated by the semiconductor laser. A transparent conductive film is formed on a predetermined surface of the diffusion plate. In addition, the laser driver drives the semiconductor laser to irradiate the laser (Continued)

light on the basis of an electric characteristic value of the conductive film.

16 Claims, 19 Drawing Sheets

(51) Int. Cl.
*H01S 5/02218* (2021.01)
*H01S 5/0233* (2021.01)
*H01S 5/024* (2006.01)
*H01S 5/042* (2006.01)

(52) U.S. Cl.
CPC ........ *H01S 5/0233* (2021.01); *H01S 5/02469* (2013.01); *H01S 5/042* (2013.01)

(56) References Cited

U.S. PATENT DOCUMENTS

| | | |
|---|---|---|
| 2008/0212914 A1 | 9/2008 | Marks |
| 2017/0353004 A1* | 12/2017 | Chen .................. H01S 5/02234 |
| 2018/0278011 A1 | 9/2018 | Galvano et al. |
| 2019/0131767 A1 | 5/2019 | Lee et al. |
| 2020/0067270 A1 | 2/2020 | Muller et al. |

FOREIGN PATENT DOCUMENTS

| | | |
|---|---|---|
| WO | WO 2018/114812 | 6/2018 |
| WO | WO 2019/202874 | 10/2019 |
| WO | WO 2020/026692 | 2/2020 |
| WO | WO 2020/059420 | 3/2020 |

OTHER PUBLICATIONS

Chime AC et al: "Analysis of Optical and 1-14 Electrical Responses of $\boldsymbol{\mu}$—OLED With Metallized ITO Coplanar Waveguide Electrodes Submitted to Nanosecond Electrical Pulses", IEEE Transactions on Electron Devices, EEE, USA, vol. 66, No. 5, May 1, 2019 (May 1, 2019), pp. 2282-2289, XP011720532.

* cited by examiner a    OVERLAP: 0% b    OVERLAP: 50% c    OVERLAP: 100%

FIG. 5

ADDITIVE METHOD (H=15μm)

| | | L | | | | |
|---|---|---|---|---|---|---|
| | | 0.3mm | 0.5mm | 1mm | 2mm | 3mm |
| W | 0.015mm | 0.21 | 0.40 | 0.94 | 2.16 | 3.48 |
| | 0.05mm | 0.16 | 0.33 | 0.79 | 1.85 | 3.02 |
| | 0.1mm | 0.13 | 0.27 | 0.68 | 1.63 | 2.69 |
| | 0.2mm | 0.09 | 0.21 | 0.56 | 1.39 | 2.33 |
| | 0.3mm | 0.07 | 0.17 | 0.48 | 1.24 | 2.11 |

FIG. 6

SUBTRACTIVE METHOD (H=35μm)

|   |        | L     |       |      |      |      |
|---|--------|-------|-------|------|------|------|
|   |        | 0.3mm | 0.5mm | 1mm  | 2mm  | 3mm  |
| W | 0.035mm| 0.16  | 0.32  | 0.77 | 1.82 | 2.98 |
|   | 0.05mm | 0.15  | 0.30  | 0.73 | 1.75 | 2.86 |
|   | 0.1mm  | 0.12  | 0.25  | 0.65 | 1.57 | 2.59 |
|   | 0.2mm  | 0.09  | 0.20  | 0.54 | 1.35 | 2.27 |
|   | 0.3mm  | 0.07  | 0.17  | 0.47 | 1.22 | 2.07 | a b c d e f l m n o p q a b a b

SEMICONDUCTOR LASER DRIVING APPARATUS, ELECTRONIC EQUIPMENT, AND MANUFACTURING METHOD OF SEMICONDUCTOR LASER DRIVING APPARATUS

CROSS REFERENCE TO RELATED APPLICATIONS

This application is a national stage application under 35 U.S.C. 371 and claims the benefit of PCT Application No. PCT/JP2020/028047, having an international filing date of 20 Jul. 2020, which designated the United States, which PCT application claimed the benefit of Japanese Patent Application No. 2019-157724, filed 30 Aug. 2019, the entire disclosures of each of which are incorporated herein by reference.

TECHNICAL FIELD

The present technique relates to a semiconductor laser driving apparatus. Specifically, the present technique relates to a semiconductor laser driving apparatus and electronic equipment including a substrate incorporating a laser driver and a semiconductor laser and a manufacturing method of the semiconductor laser driving apparatus.

BACKGROUND ART

In an electronic apparatus having a distance measurement function, a distance measurement system called ToF (Time of Flight) has often been used from the past. ToF is a system in which a light emitting unit irradiates an object with irradiation light of a sine wave or a rectangular wave, a light receiving unit receives the reflected light from the object, and a distance measurement computing unit measures a distance on the basis of a phase difference between the irradiation light and the reflected light. In order to realize such a distance measurement function, there is known an optical module in which a light emitting element and an electronic semiconductor chip for driving the light emitting element are housed in a case and integrated. For example, an optical module that includes a laser diode mounted in an array on an electrode pattern of a substrate and a diffusion plate that diffuses laser light of the laser diode has been proposed (refer to, for example, PTL 1).

CITATION LIST

Patent Literature

[PTL 1]
Japanese Patent Laid-open No. 2009-170675

SUMMARY

Technical Problems

In the related art described above, since the diffusion plate diffuses the laser light, it is possible to realize an eye-safe light source that is less likely to cause damage to the eyes. However, the diffusion plate may be damaged or peeled off due to, for example, impact or aged deterioration in the related art described above. When such damage or the like of the diffusion plate occurs during irradiation of the laser light, there is a risk that the laser light is output without being diffused and the safety of the semiconductor laser driving apparatus is lowered.

The present technique has been developed in view of such a situation, and an object thereof is to improve safety in a semiconductor laser driving apparatus that diffuses laser light by a diffusion plate.

Solution to Problems

The present technique has been made in order to solve the above-described problems, a first aspect thereof is to provide a semiconductor laser driving apparatus and a manufacturing method thereof, the semiconductor laser driving apparatus including a substrate incorporating a laser driver, a semiconductor laser mounted on one surface of the substrate, connection wiring that electrically connects the laser driver and the semiconductor laser to each other with a wiring inductance of 0.5 nanohenries or less, a diffusion plate that diffuses laser light irradiated by the semiconductor laser, and a transparent conductive film formed on a predetermined surface of the diffusion plate, and the laser driver drives the semiconductor laser to irradiate the laser light on the basis of an electric characteristic value of the conductive film. This leads to an effect of irradiating the laser light on the basis of the electric characteristic value of the conductive film.

In addition, in the first aspect, outer walls surrounding a region including the semiconductor laser can be further provided on the one surface of the substrate, and the diffusion plate can cover an upper part of the region surrounded by the outer walls.

In addition, in the first aspect, wiring for connecting the conductive film and the laser driver to each other along the outer walls may be further provided. This leads to an effect of measuring the electric characteristic value via the wiring.

In addition, in the first aspect, the outer walls may include ceramic and a through via that penetrates the ceramic to connect the conductive film and the laser driver to each other. This leads to an effect of measuring the electric characteristic value via the through via.

In addition, in the first aspect, the outer walls may include a resin mold and a through via that penetrates the resin mold to connect the conductive film and the laser driver to each other. This leads to an effect of measuring the electric characteristic value via the through via.

In addition, in the first aspect, the electric characteristic value may be resistivity, and the laser driver may irradiate the laser light in a case where the resistivity is less than a predetermined threshold value. This leads to an effect of stopping the laser light when the diffusion plate is damaged or the like.

In addition, in the first aspect, it is desirable that the connection wiring have a length of 0.5 millimeters or less. In addition, it is more preferable that the connection wiring be 0.3 millimeters or less.

In addition, in the first aspect, the connection wiring may be provided via a connection via provided in the substrate. This leads to an effect of shortening the wiring length.

In addition, in the first aspect, the semiconductor laser may be arranged in such a manner that a part thereof overlaps an upper part of the laser driver. In this case, the semiconductor laser may be arranged in such a manner that a part corresponding to 50% or less of the area thereof overlaps the upper part of the laser driver.

In addition, in the first aspect, the substrate may include a thermal via at a position where the semiconductor laser is mounted. This leads to an effect of promoting heat radiation.

In addition, in the first aspect, a photodiode that is mounted on the one surface of the substrate to monitor the light intensity of the laser light irradiated from the semiconductor laser may be further provided. This leads to an effect of keeping the output of the semiconductor laser constant.

In addition, in the first aspect, a connection terminal for establishing connection with the outside may be further provided on a surface opposite to the one surface of the substrate. This leads to an effect of securing the connection with the outside. In this case, the connection terminal may be formed by using at least any one of a solder ball, a copper core ball, a copper pillar bump, and a land grid array.

In addition, a second aspect of the present technique is to provide electronic equipment including a substrate incorporating a laser driver, a semiconductor laser mounted on one surface of the substrate, connection wiring that electrically connects the laser driver and the semiconductor laser to each other with a wiring inductance of 0.5 nanohenries or less, a diffusion plate that diffuses laser light irradiated by the semiconductor laser, and a transparent conductive film formed on a predetermined surface of the diffusion plate, and the laser driver drives the semiconductor laser to irradiate the laser light on the basis of an electric characteristic value of the conductive film. This leads to an effect of irradiating the laser light on the basis of the electric characteristic value of the conductive film.

BRIEF DESCRIPTION OF DRAWINGS

FIG. 5 is a diagram for illustrating a numerical example of a wiring inductance with respect to a wiring length L and a wiring width W in the case where a wiring pattern is formed by an additive method.

FIG. 6 is a diagram for illustrating a numerical example of the wiring inductance with respect to the wiring length L and the wiring width W in the case where a wiring pattern is formed by a subtractive method.

DESCRIPTION OF EMBODIMENT

Hereinafter, a mode for carrying out the present technique (hereinafter, referred to as an embodiment) will be described. The description will be given in the following order.

1. Embodiment (semiconductor laser driving apparatus)
2. Application example (electronic equipment)

1. Embodiment

[Semiconductor Laser Driving Apparatus]

Figure 1:
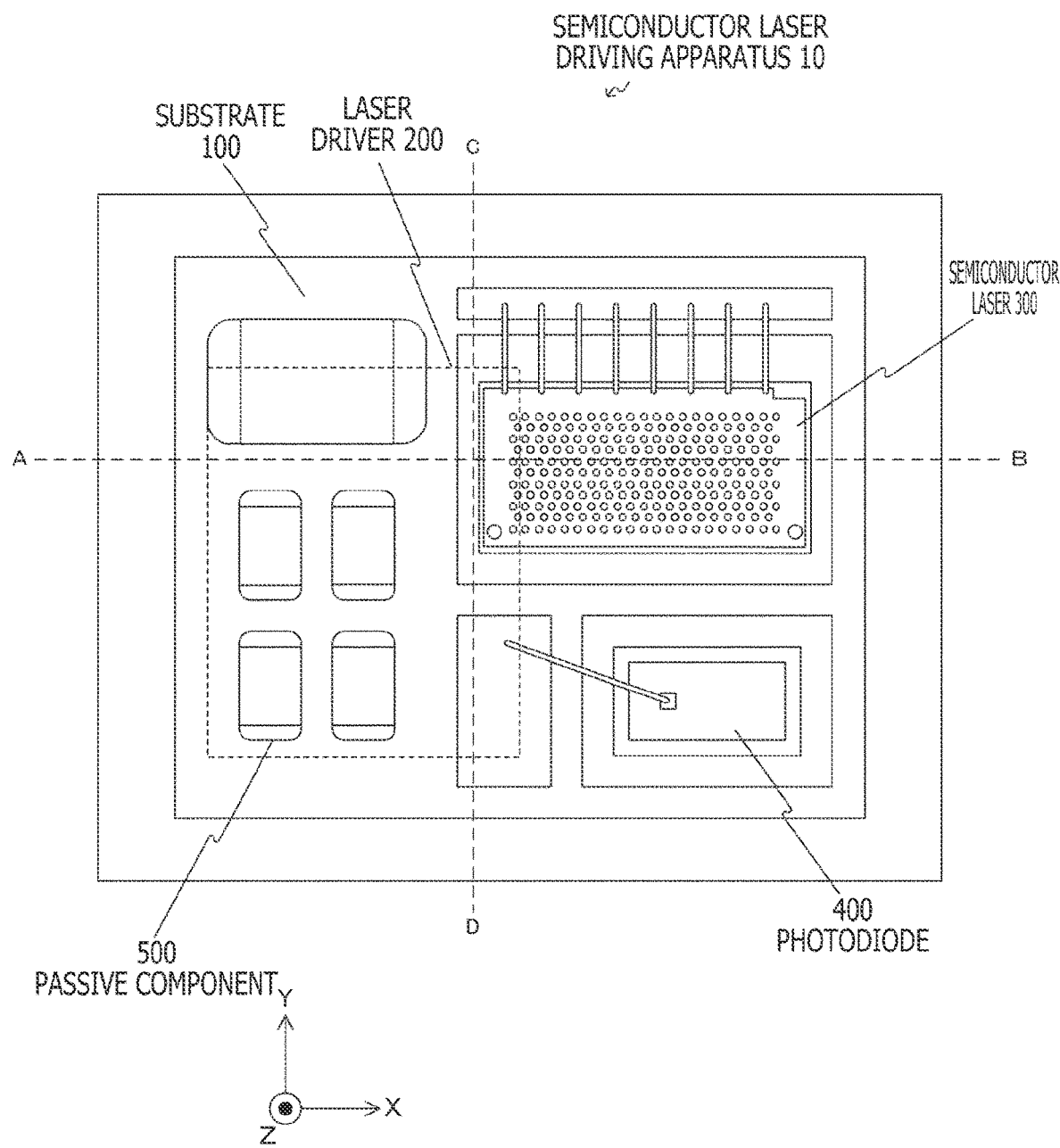
FIG. 1 is a diagram for illustrating an example of a top view of a semiconductor laser driving apparatus 10 according to an embodiment of the present technique.

FIG. 1 is a diagram for illustrating an example of a top view of a semiconductor laser driving apparatus 10 according to an embodiment of the present technique.

The semiconductor laser driving apparatus 10 assumes measurement of a distance by ToF. ToF is high in depth accuracy although not as high as the structured light, and has such a characteristic that it can operate in a dark environment without any problem. In addition, ToF is considered to have many advantages as compared with other systems such as the structured light and the stereo camera in terms of the simplicity of the apparatus configuration and cost.

In the semiconductor laser driving apparatus 10, a semiconductor laser 300, a photodiode 400, and a passive component 500 are electrically connected by wire bonding and mounted on the surface of a substrate 100 incorporating a laser driver 200. As the substrate 100, a printed wiring board is assumed.

The semiconductor laser 300 is a semiconductor device that emits laser light by allowing a current to flow through a PN junction of a compound semiconductor. Here, as the compound semiconductor to be used, for example, aluminum gallium arsenide (AlGaAs), indium gallium arsenide phosphorus (InGaAsP), aluminum gallium indium phosphorus (AlGaInP), gallium nitride (GaN), and the like are assumed.

The laser driver 200 is a driver integrated circuit (IC) for driving the semiconductor laser 300. The laser driver 200 is incorporated in the substrate 100 in a face-up state. Regarding the electrical connection between the laser driver 200 and the semiconductor laser 300, since the wiring inductance needs to be reduced, it is desirable to make the wiring length as short as possible. This specific value will be described later.

The photodiode 400 is a diode for detecting light. The photodiode 400 is used for APC (Automatic Power Control) for maintaining the output of the semiconductor laser 300 constant by monitoring the light intensity of reflection light with respect to the laser light from the semiconductor laser 300.

The passive component 500 is a circuit component other than active elements such as a capacitor and a resistor. The passive component 500 includes a decoupling capacitor for driving the semiconductor laser 300.

Hereinafter, an axis perpendicular to the substrate 100 will be referred to as a "Z axis." In addition, a predetermined axis parallel to the substrate 100 will be referred to as an "X axis," and an axis perpendicular to the X axis and the Z axis will be referred to as a "Y axis."

Figure 2:
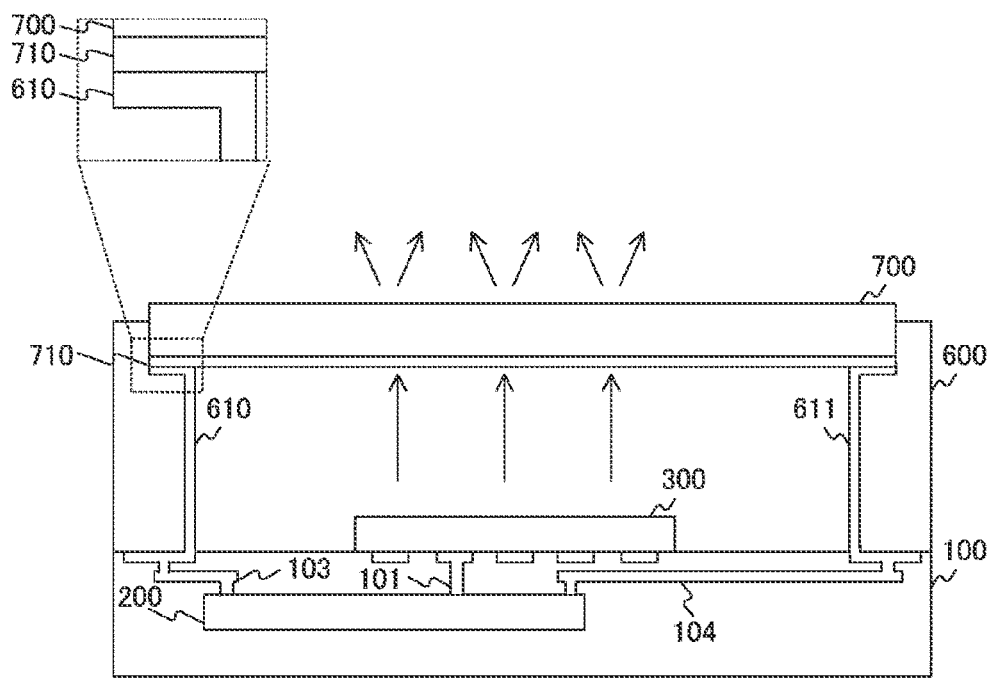
FIG. 2 is a diagram for illustrating an example of a cross-sectional view of the semiconductor laser driving apparatus 10 being cut along a Y axis in the embodiment of the present technique.

FIG. 2 is a diagram for illustrating an example of a cross-sectional view of the semiconductor laser driving apparatus 10 being cut along the Y axis in the embodiment of the present technique. For example, the cross-sectional view of FIG. 2 can be obtained by cutting the substrate 100 along the line segment C-D of FIG. 1.

As exemplified in FIG. 2, when one of two faces of the substrate 100 is assumed as a surface, the semiconductor laser 300 is mounted on the surface. In addition, the laser driver 200 is incorporated in the substrate 100, and the laser driver 200 is connected to the semiconductor laser 300 via a connection via 101. In addition, wiring 103 and wiring 104 are formed in the substrate 100, and the wiring 103 and the like are connected to the laser driver 200.

In addition, side walls 600 are formed on the surface of the substrate 100 so as to surround a central region where the semiconductor laser 300 and the like are mounted. Connection wiring 610 and connection wiring 611 are arranged along the inner wall surfaces of the side walls 600. The connection wiring 610 and the like are formed when side walls 600 are injection molded. Such components such as the side walls 600 on which a pattern such as wiring is formed at the time of injection molding are also called an MID (Molded Interconnect Device). It should be noted that, although the wiring of the MID is used as the connection wiring 610 and the like, the present invention is not limited to this configuration, and the wiring can be formed by insert formation. In addition, the side walls 600 are an example of the outer walls described in the claims.

In addition, when the direction from the rear surface to the surface of the substrate 100 is assumed as an upside, a diffusion plate 700 covers the upside of the surface of the substrate 100 surrounded by the side walls 600. A transparent conductive film 710 is formed on the lower surface of the diffusion plate 700. As the conductive film 710, for example, an ITO (Indium Tin Oxide) film is formed. The conductive film 710 covers at least a part of the lower surface of the diffusion plate 700, but desirably covers the entire surface of the diffusion plate 700.

The above-described connection wiring 610 connects one of two connection points on the lower surface of the conductive film 710 to the wiring 103, and the connection wiring 611 connects the other of the two connection points to the wiring 104. Since the wiring 103 and the wiring 104 are connected to the laser driver 200, the conductive film 710 and the laser driver 200 are electrically connected to each other via the connection wiring 610 and the connection wiring 611.

The laser driver 200 supplies a current to the conductive film 710 to measure the electric characteristic value thereof, and drives the semiconductor laser 300 to irradiate laser light on the basis of the measured value.

Here, the diffusion plate 700 may be damaged or peeled off due to impact or aged deterioration. When such damage or the like of the diffusion plate 700 occurs during irradiation of the laser light, there is a risk that the laser light is output without being diffused and the safety of the semiconductor laser driving apparatus 10 is lowered.

In the case where the diffusion plate 700 is completely peeled off, there is no reflected light received by the photodiode 400, and thus the laser driver 200 can reduce the output of the laser light to improve the safety in the above-described APC control. However, in the case where the diffusion plate 700 is not completely peeled off and a part thereof remains, the laser light is reflected by the remaining diffusion plate 700 and the brightness is not lowered, so that the output of the laser light is kept constant and the safety is lowered. Even in the case where damage such as cracks occurs, the brightness of the reflected light is similarly not lowered, and thus the output of the laser light is kept unchanged. Thus, the safety cannot be sufficiently improved by the APC control.

On the other hand, when the diffusion plate 700 is peeled off or damaged, the conductivity of the conductive film 710 formed on the diffusion plate 700 becomes low (in other words, the resistivity that is the reciprocal of the conductivity becomes high) regardless of the brightness of the reflected light. Thus, the laser driver 200 can reliably detect the presence or absence of damage or peeling-off of the diffusion plate 700 from a change in the electric characteristic value (the resistivity and the like) of the conductive film 710.

For example, in the case where the resistivity of the conductive film 710 is measured, the laser driver 200 irradiates laser light when the resistivity is equal to or less than a predetermined threshold value. The value of the resistivity when the diffusion plate 700 is not damaged or peeled off is set as the threshold value. On the other hand, when the resistivity is higher than the threshold value (that is, when the diffusion plate 700 is damaged or the like), the laser driver 200 stops the irradiation of the laser light. It should be noted that when the resistivity is higher than the threshold value, the laser driver 200 may lower the brightness without stopping the irradiation of the laser light.

It should be noted that the laser driver 200 can also measure electric characteristic values (the conductivity, voltage, and the like) other than the resistivity. When the conductivity is measured, the laser driver 200 is only required to stop the laser light when the conductivity is equal to or less than a predetermined threshold value.

As described above, the laser driver 200 stops the semiconductor laser 300 on the basis of the electric characteristic value of the conductive film 710, when the diffusion plate 700 is damaged or peeled off, so that the safety can be improved as compared to a case in which only the APC control is performed.

Figure 3:
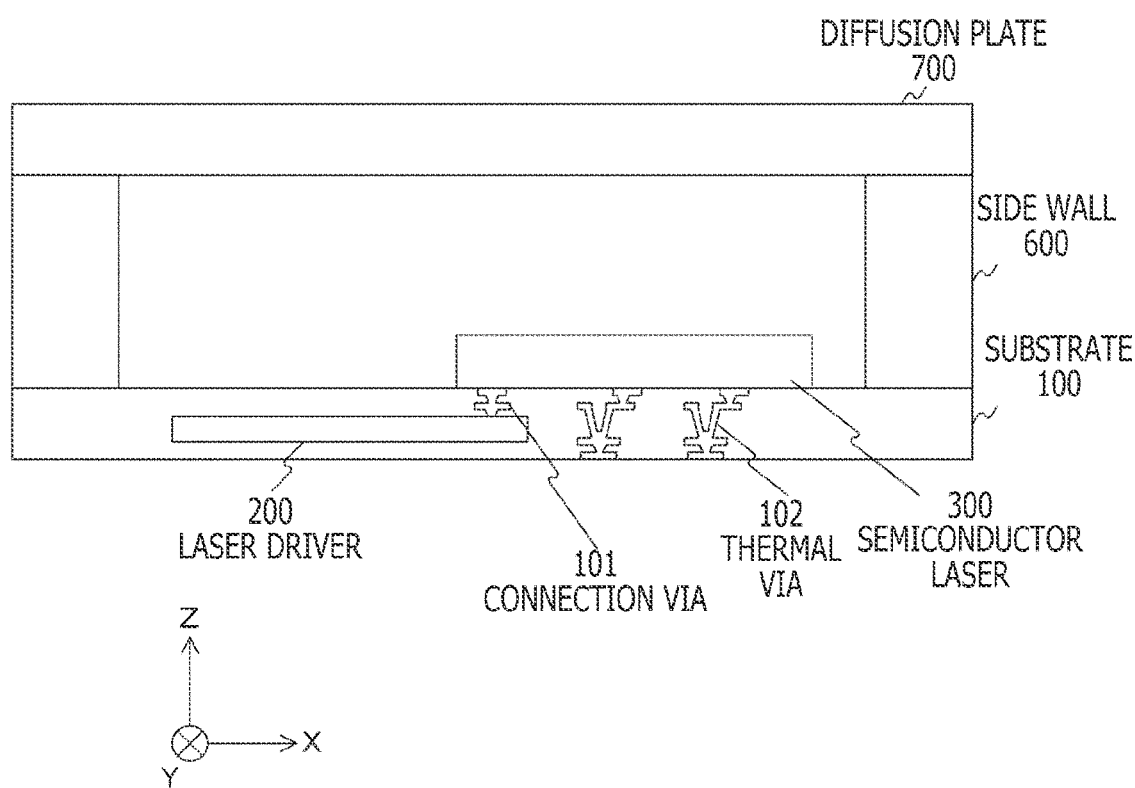
FIG. 3 is a diagram for illustrating an example of a cross-sectional view of the semiconductor laser driving apparatus 10 being cut along an X axis in the embodiment of the present technique.

FIG. 3 is a diagram for illustrating an example of a cross-sectional view of the semiconductor laser driving apparatus 10 being cut along the X axis in the embodiment of the present technique. For example, the cross-sectional view of FIG. 3 can be obtained by cutting the substrate 100 along the line segment A-B of FIG. 1.

As described above, the substrate 100 incorporates the laser driver 200, and the semiconductor laser 300 and the like are mounted on the surface thereof. The connection between the semiconductor laser 300 and the laser driver 200 is made via the connection via 101. The wiring length can be shortened by using the connection via 101. It should be noted that the connection via 101 is an example of the connection wiring described in the claims.

In addition, the substrate 100 includes a thermal via 102 for heat radiation. Each component mounted on the substrate 100 is a heat generating source, and heat generated in each component can be radiated from the rear surface of the substrate 100 by using the thermal via 102.

The semiconductor laser 300, the photodiode 400, and the passive component 500 mounted on the surface of the substrate 100 are surrounded by the side walls 600. As a material of the side walls 600, for example, a plastic material or metal is assumed.

The upper surface surrounded by the side walls 600 is covered with the diffusion plate 700. The diffusion plate 700 is an optical element for diffusing the laser light from the semiconductor laser 300, and is also called a diffuser.

Figure 4:
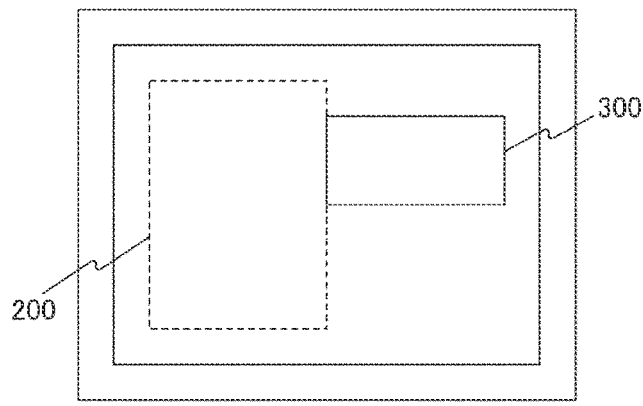
FIG. 4 depicts diagrams each illustrating the definition of an amount of overlap between a laser driver 200 and a semiconductor laser 300 according to the embodiment of the present technique.
Figure 4:
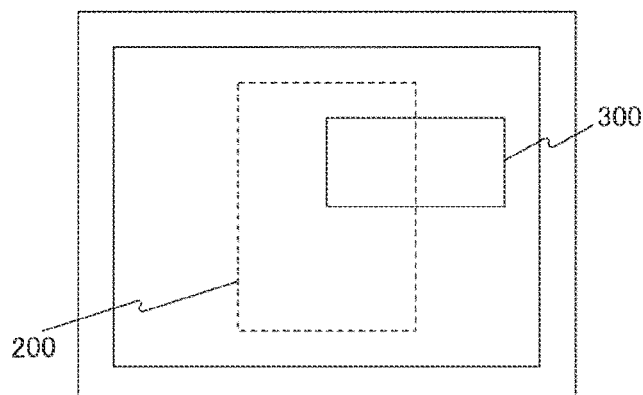
Figure 4:
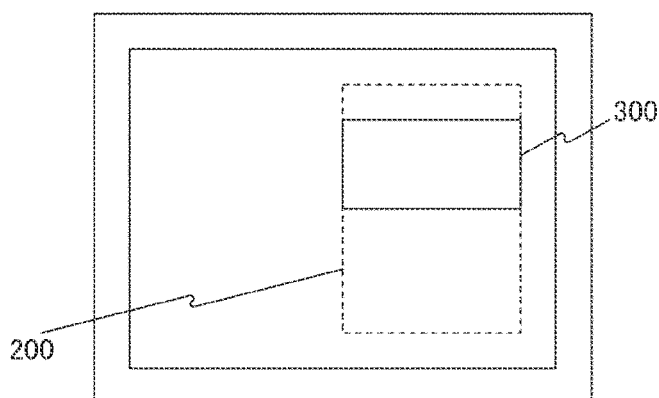

FIG. 4 depicts diagrams each illustrating the definition of an amount of overlap between the laser driver 200 and the semiconductor laser 300 according to the embodiment of the present technique.

As described above, since the connection between the semiconductor laser 300 and the laser driver 200 is assumed to be made via the connection via 101, the semiconductor laser 300 and the laser driver 200 are arranged while being overlapped one on another when viewed from the upper surface. On the other hand, it is desirable to provide a thermal via 102 on the lower surface of the semiconductor laser 300, and it is also necessary to secure a region therefor. Accordingly, in order to clarify the positional relation between the laser driver 200 and the semiconductor laser 300, the amount of overlap between the two is defined as follows.

In the arrangement illustrated in a of FIG. 4, there is no overlap region between the two when viewed from the upper surface. The overlap amount in this case is defined as 0%. On the other hand, in the arrangement illustrated in c of FIG. 4, the entire semiconductor laser 300 overlaps the laser driver 200 when viewed from the upper surface. The overlap amount in this case is defined as 100%.

Then, in the arrangement illustrated in b of FIG. 4, the half region of the semiconductor laser 300 overlaps the laser driver 200 when viewed from the upper surface. The overlap amount in this case is defined as 50%.

In the embodiment, the overlap amount is desirably larger than 0% to provide a region for the above-described connection via 101. On the other hand, when considering that a certain number of thermal vias 102 are to be arranged directly under the semiconductor laser 300, the overlap amount is desirably 50% or less. Thus, by making the overlap amount larger than 0% but 50% or less, the wiring inductance is reduced, and excellent heat radiation characteristics can be obtained.

[Wiring Inductance]

As described above, the wiring inductance becomes a problem in the connection between the semiconductor laser 300 and the laser driver 200. All conductors have an inductive component, and even an inductance of an extremely short lead wire may cause adverse effects in high frequency regions such as a ToF system. That is, when a high frequency operation is performed, the driving waveform for driving the semiconductor laser 300 from the laser driver 200 is distorted due to the influence of the wiring inductance, and the operation may become unstable.

Here, a theoretical equation for calculating the wiring inductance is examined. For example, the inductance IDC [μH] of a straight lead wire having a circular cross section with a length L [mm] and a radius R [mm] is represented in free space by the following equation. Note that ln represents the natural logarithm.

$$IDC=0.0002L \cdot (\ln(2L/R)-0.75)$$

In addition, for example, the inductance IDC [μH] of a strip line (substrate wiring pattern) having a length L [mm], a width W [mm], and a thickness H [mm] is represented in free space by the following equation.

$$IDC=0.0002L \cdot (\ln(2L/(W+H))+0.2235((W+H)/L)+0.5)$$

FIG. 4 and FIG. 5 illustrate the preliminary calculation of the wiring inductance [nH] between the laser driver incorporated inside the printed wiring board and the semiconductor laser electrically connected to an upper portion of the printed wiring board.

FIG. 5 is a diagram for illustrating a numerical example of a wiring inductance with respect to a wiring length L and a wiring width W in the case where a wiring pattern is formed by an additive method. The additive method is a method of forming a pattern by depositing copper only on a necessary part of an insulating resin surface.

FIG. 6 is a diagram for illustrating a numerical example of the wiring inductance with respect to the wiring length L and the wiring width W in the case where a wiring pattern is formed by a subtractive method. The subtractive is a method of forming a pattern by etching an unnecessary part of a copper-clad laminate.

In the case of a semiconductor laser driving apparatus such as a ToF system, when assuming to drive at several hundred megahertz, the wiring inductance is desirably 0.5 nH or less, and more preferably 0.3 nH or less. Thus, when considering the above-described preliminary calculation result, it is considered that the wiring length between the semiconductor laser 300 and the laser driver 200 is desirably 0.5 millimeters or less, and more preferably 0.3 millimeters or less.

[Manufacturing Method]

Figure 7:
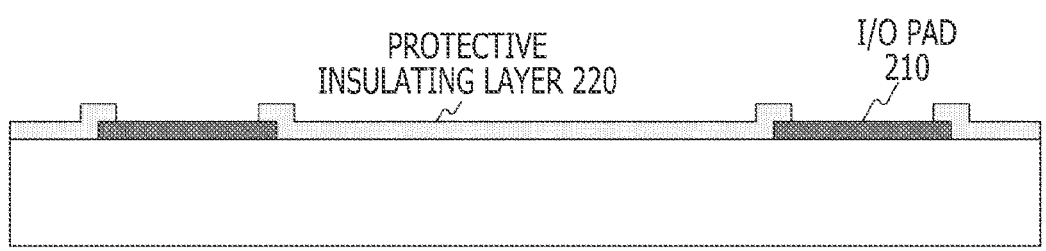
FIG. 7 depicts first diagrams each illustrating an example of a process of processing a copper land and copper redistribution layer (RDL) in a manufacturing process of the laser driver 200 according to the embodiment of the present technique.
Figure 7:
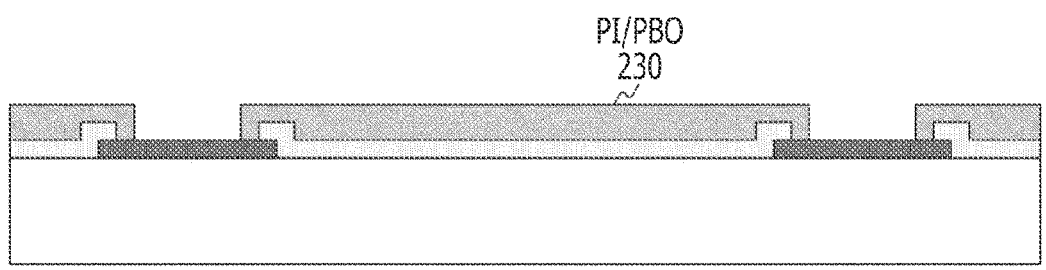
Figure 7:
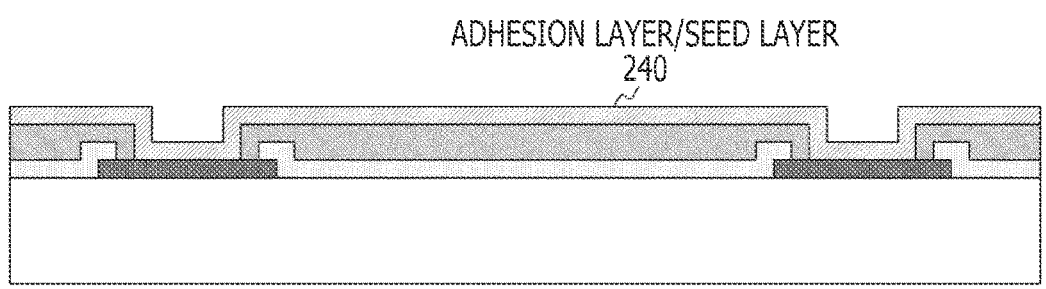
Figure 8:
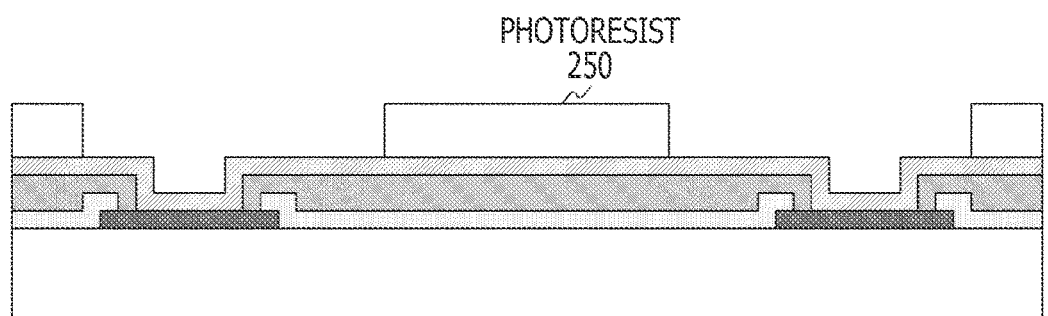
FIG. 8 depicts second diagrams each illustrating an example of a process of processing the copper land and copper redistribution layer (RDL) in the manufacturing process of the laser driver 200 according to the embodiment of the present technique.
Figure 8:
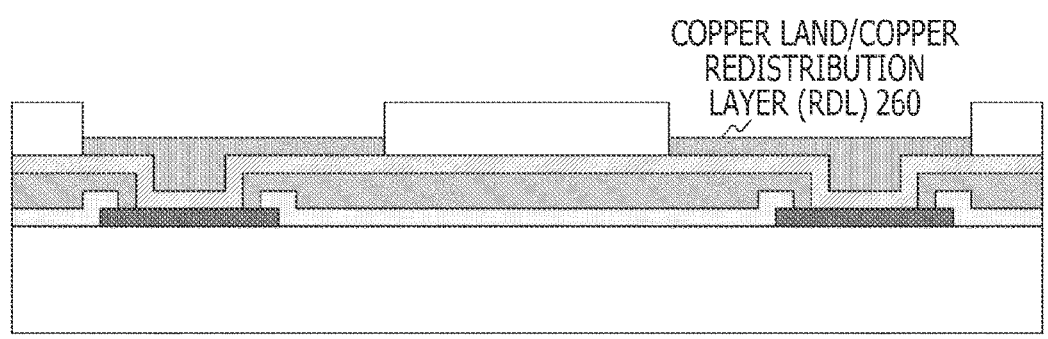
Figure 8:
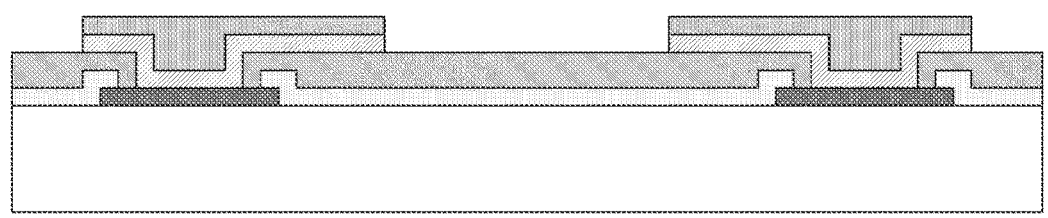

FIG. 7 and FIG. 8 are diagrams each illustrating an example of a process of processing a copper land and copper redistribution layer (RDL) in a manufacturing process of the laser driver 200 of the embodiment of the present technique.

First, as illustrated in a of FIG. 7, an I/O pad 210 made of, for example, aluminum or the like is formed on a semiconductor wafer. Then, a protective insulating layer 220 such as SiN is deposited on the surface, and a region of the I/O pad 210 is opened.

Next, as illustrated in b of FIG. 7, a surface protective film 230 made of polyimide (PI) or polybenzoxazole (PBO) is deposited, and a region of the I/O pad 210 is opened.

Then, as illustrated in c of FIG. 7, titanium tungsten (TiW) of approximately several tens to hundreds nm and copper (Cu) of approximately 100 to 1000 nm are sequentially sputtered to form an adhesion layer and seed layer 240. Here, in addition to titanium tungsten (TiW), a refractory metal such as chromium (Cr), nickel (Ni), titanium (Ti), titanium copper (TiCu), or platinum (Pt), or an alloy thereof may be applied to the adhesion layer. Further, in addition to copper (Cu), nickel (Ni), silver (Ag), gold (Au), or an alloy thereof may be applied to the seed layer.

Subsequently, as illustrated in d of FIG. 8, a photoresist 250 is patterned in order to form a copper land and copper redistribution layer for electrical bonding. Specifically, the copper land and copper redistribution layer for electrical bonding is formed by each of processes of surface cleaning, resist coating, drying, exposure, and development.

Then, as illustrated in e of FIG. 8, a copper land and copper redistribution layer (RDL) 260 for electrical bonding is formed on the adhesion layer and seed layer 240 by a plating method. Here, as the plating method, for example, an electrolytic copper plating method, an electrolytic nickel plating method, or the like can be used. In addition, it is desirable that the diameter of the copper land be approximately 50 to 100 micrometers, the thickness of the copper redistribution layer be approximately 3 to 10 micrometers, and the minimum width of the copper redistribution layer be approximately 10 micrometers.

Next, as illustrated in f of FIG. 8, the photoresist 250 is removed, and the copper land and copper redistribution layer (RDL) 260 of the semiconductor chip is masked and dry-etched. Here, as the dry etching, for example, ion milling for applying an argon ion beam can be used. An unnecessary region of the adhesion layer and seed layer 240 can be selectively removed by the dry etching, and the copper land and copper redistribution layers are separated from each other. It should be noted that the unnecessary region can be removed by wet etching using an aqueous solution of aqua regia, cerium (TV) nitrate ammonium, or potassium hydroxide, but is desirably removed by dry etching in consideration of side etching and thickness reduction of metal layers configuring the copper land and copper redistribution layer.

FIG. 9 to FIG. 13 are diagrams each illustrating an example of a manufacturing process of the substrate 100 according to the embodiment of the present technique.

Figure 9:
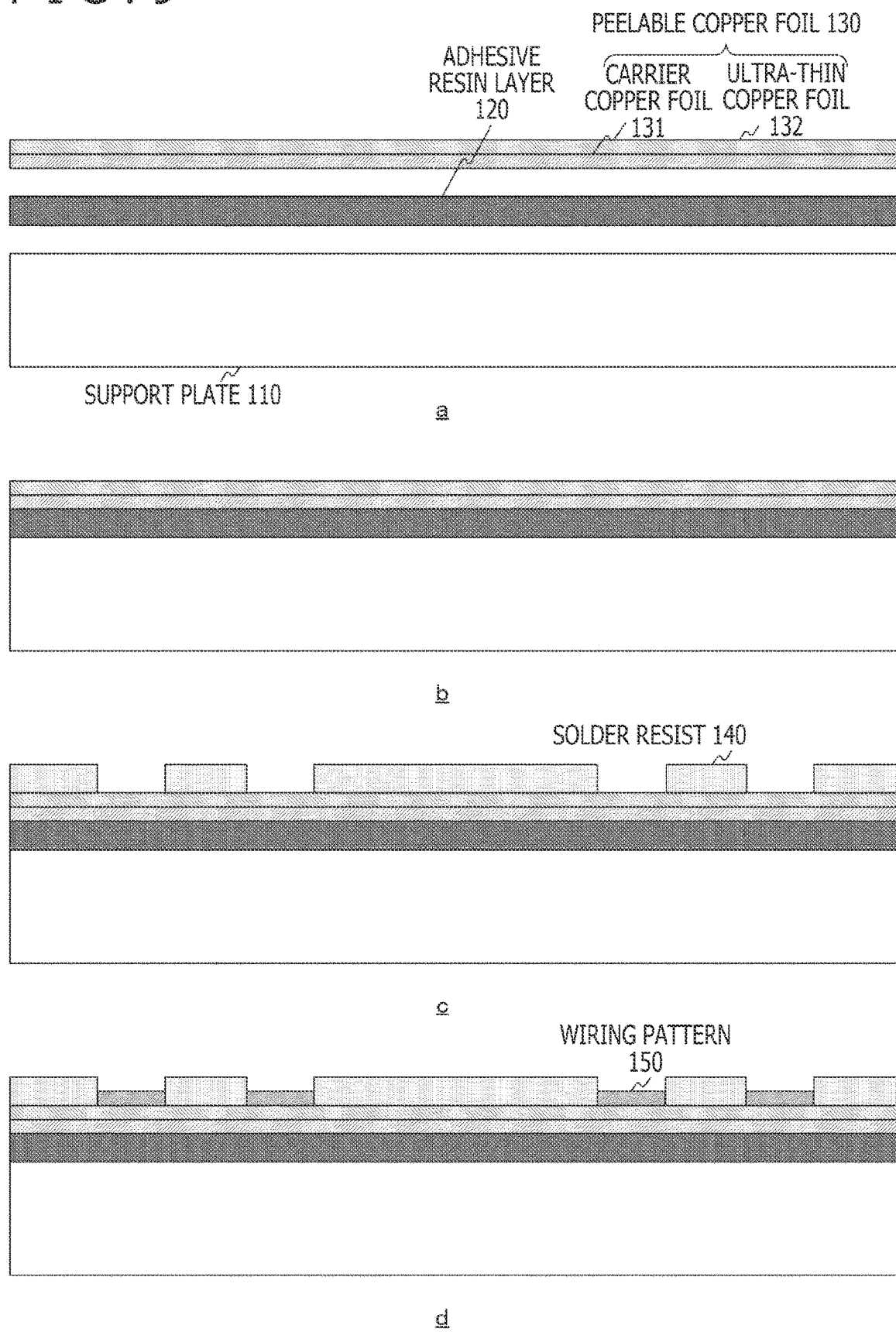
FIG. 9 depicts first diagrams each illustrating an example of a manufacturing process of a substrate 100 according to the embodiment of the present technique.

First, as illustrated in a of FIG. 9, a peelable copper foil 130 having a two-layer structure of an ultra-thin copper foil 132 and a carrier copper foil 131 is thermocompression bonded to one surface of a support plate 110 via an adhesive resin layer 120 by roll laminating or laminating press.

As the support plate 110, a substrate made of an inorganic material, a metal material, a resin material, or the like can be used. For example, silicon (Si), glass, ceramic, copper, a copper-based alloy, aluminum, an aluminum alloy, stainless steel, a polyimide resin, or an epoxy resin can be used.

The carrier copper foil 131 having a thickness of 18 to 35 micrometers is vacuum-adhered to the ultra-thin copper foil 132 having a thickness of 2 to 5 micrometers, to be used as the peelable copper foil 130. As the peelable copper foil 130, for example, 3FD-P3/35 (made by Furukawa Circuit Foil Co., Ltd.), MT-18S5DH (made by MITSUI MINING & SMELTING CO., LTD.), or the like can be used.

As a resin material of the adhesive resin layer 120, an organic resin containing a reinforcing material of a glass fiber, such as an epoxy resin, a polyimide resin, a PPE resin, a phenol resin, a PTFE resin, a silicon resin, a polybutadiene resin, a polyester resin, a melamine resin, a urea resin, a PPS resin, and a PPO resin can be used. In addition, as the reinforcing material, an aramid nonwoven fabric, an aramid fiber, a polyester fiber, or the like can be used in addition to the glass fiber.

Next, as illustrated in b of FIG. 9, a plating base conductive layer (not illustrated) having a thickness of 0.5 to 3 micrometers is formed on the surface of the ultra-thin copper foil 132 of the peelable copper foil 130 by an electroless copper plating treatment. It should be noted that, in the electroless copper plating treatment, a conductive layer is formed as a base of electrolytic copper plating for forming a wiring pattern next. However, by omitting the electroless copper plating treatment, an electrode for electrolytic copper plating may be brought into direct contact with the peelable copper foil 130, and an electrolytic copper plating treatment may be directly applied on the peelable copper foil 130 to form a wiring pattern.

Then, as illustrated in c of FIG. 9, a photosensitive resist is pasted on the surface of the support plate by roll laminating, to form a resist pattern (solder resist 140) for a wiring pattern. As the photosensitive resist, for example, a plating resist of a dry film can be used.

Subsequently, as illustrated in d of FIG. 9, a wiring pattern 150 having a thickness of approximately 15 micrometers is formed by an electrolytic copper plating treatment.

Figure 10:
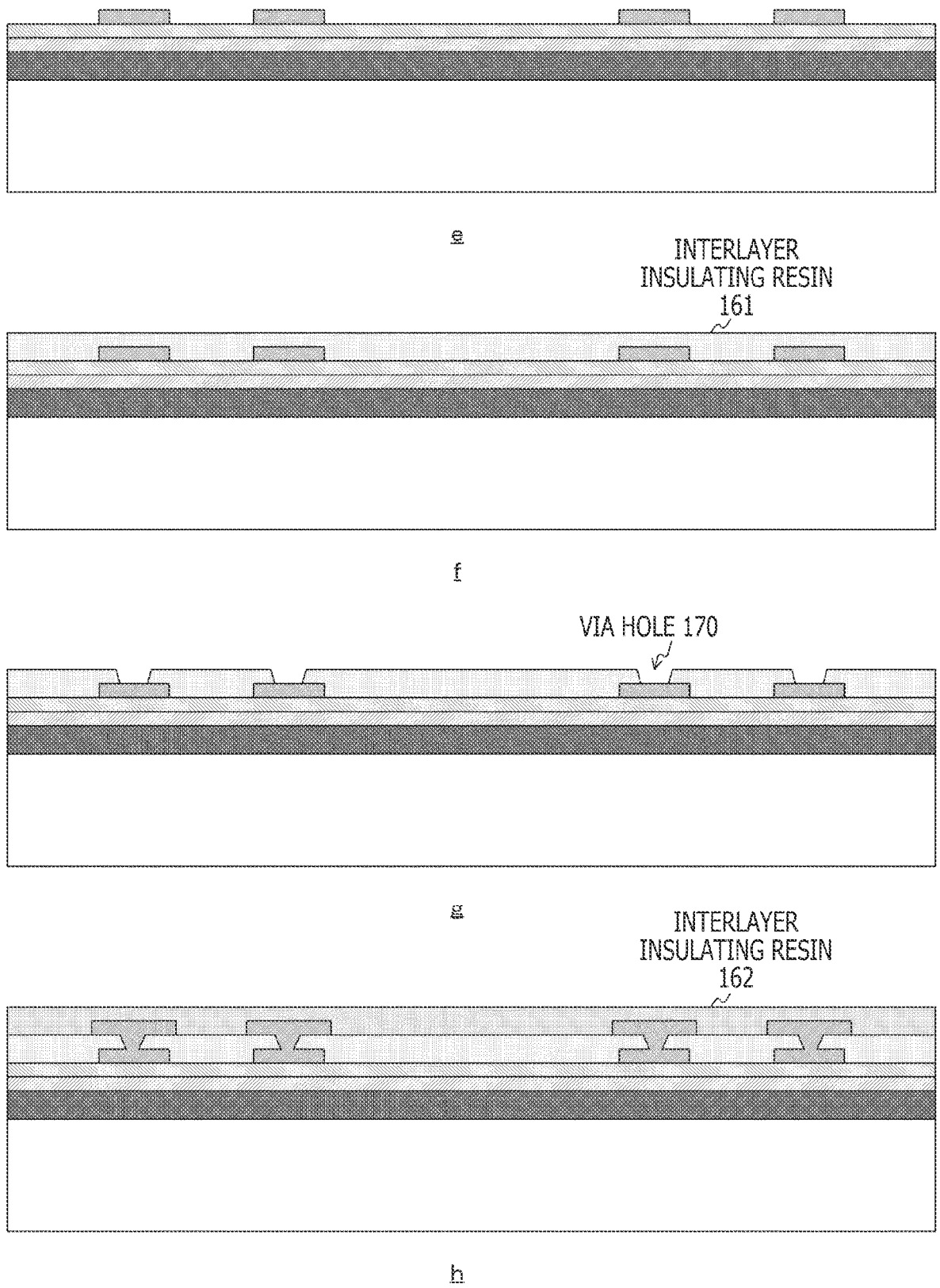
FIG. 10 depicts second diagrams each illustrating an example of the manufacturing process of the substrate 100 according to the embodiment of the present technique.

Then, as illustrated in e of FIG. 10, the plating resist is peeled off. Then, as a pretreatment for forming an interlayer insulating resin, the surface of the wiring pattern is roughened to improve the adhesion between the interlayer insulating resin and the wiring pattern. It should be noted that the roughening treatment can be performed by a blackening treatment by an oxidation/reduction treatment or a soft etching treatment using a sulfuric acid hydrogen peroxide mixture.

Next, as illustrated in f of FIG. 10, an interlayer insulating resin 161 is thermocompression bonded on the wiring pattern by roll laminating or laminating press. For example, an epoxy resin having a thickness of 45 micrometers is roll-laminated. In the case where a glass epoxy resin is used, copper foils having any thickness are superposed and thermocompression bonded by laminating press. As a resin material of the interlayer insulating resin 161, an organic resin such as an epoxy resin, a polyimide resin, a PPE resin, a phenol resin, a PTFE resin, a silicon resin, a polybutadiene resin, a polyester resin, a melamine resin, a urea resin, a PPS resin, and a PPO resin can be used. In addition, these resins alone or a combination of resins obtained by mixing a plurality of resins or preparing a compound can be used. Further, an interlayer insulating resin obtained by containing an inorganic filler in these materials or mixing a reinforcing material of a glass fiber can also be used.

Then, as illustrated in g of FIG. 10, a via hole for interlayer electrical connection is formed by a laser method or a photoetching method. In the case where the interlayer insulating resin 161 is a thermosetting resin, the via hole is formed by a laser method. As a laser beam, an ultraviolet laser such as a harmonic YAG laser or an excimer laser or an infrared laser such as a carbon dioxide gas laser can be used. It should be noted that, in the case where the via hole is formed by a laser beam, a desmear treatment is performed because a thin resin film may remain at the bottom of the via hole. In the desmear treatment, the resin is swollen by a strong alkali, and the resin is decomposed and removed by using an oxidizing agent such as chromic acid or a permanganate aqueous solution. In addition, the resin can also be removed by a plasma treatment or a sandblasting treatment by an abrasive material. In the case where the interlayer insulating resin 161 is a photosensitive resin, the via hole 170 is formed by a photoetching method. That is, the via hole 170 is formed by development after exposure using ultraviolet rays through a mask.

Next, after the roughening treatment, an electroless plating treatment is performed on the wall surface of the via hole 170 and the surface of the interlayer insulating resin 161. Then, a photosensitive resist is pasted by roll laminating on the surface of the interlayer insulating resin 161 subjected to the electroless plating treatment. As the photosensitive resist in this case, for example, a photosensitive plating resist film of a dry film can be used. The photosensitive plating resist film is exposed and then developed, so that a plating resist pattern with the portion of the via hole 170 and the portion of the wiring pattern being opened is formed. Subsequently, the opening portions of the plating resist pattern are subjected to a treatment of applying an electrolytic copper plating having a thickness of 15 micrometers. Then, the plating resist is peeled off, and the electroless plating remaining on the interlayer insulating resin is removed by flash etching using a sulfuric acid hydrogen peroxide mixture or the like, so that the via hole 170 filled with copper plating and the wiring pattern as illustrated in h of FIG. 9 are formed. Then, the similar steps of roughening the wiring pattern and forming the interlayer insulating resin 162 are repeated.

Subsequently, as illustrated in i of FIG. 11, the laser driver 200 with a die attach film (DAF) 290 obtained by processing the copper land and copper redistribution layer with a thickness reduced to approximately 30 to 50 micrometers is mounted in a face-up state.

Figure 11:
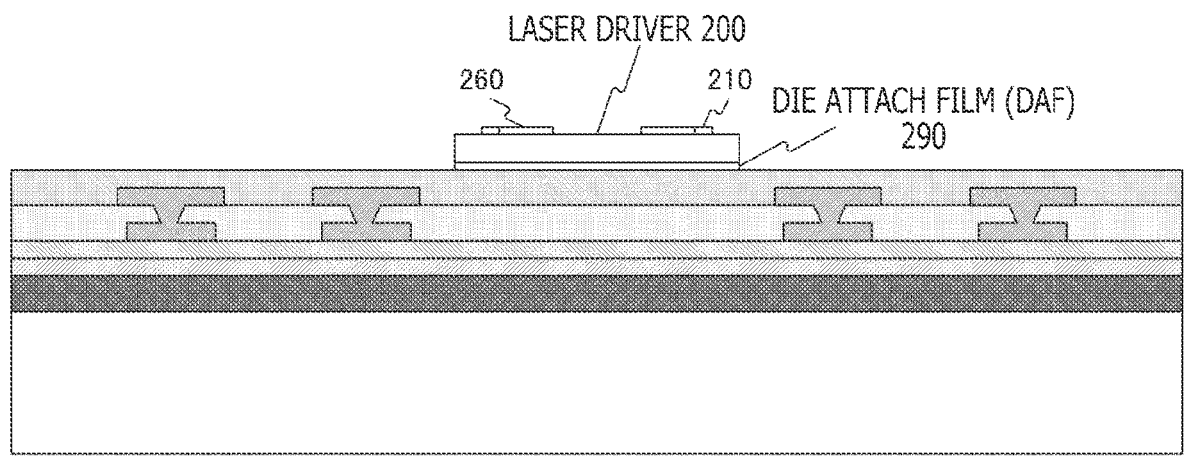
FIG. 11 depicts third diagrams each illustrating an example of the manufacturing process of the substrate 100 according to the embodiment of the present technique.
Figure 11:
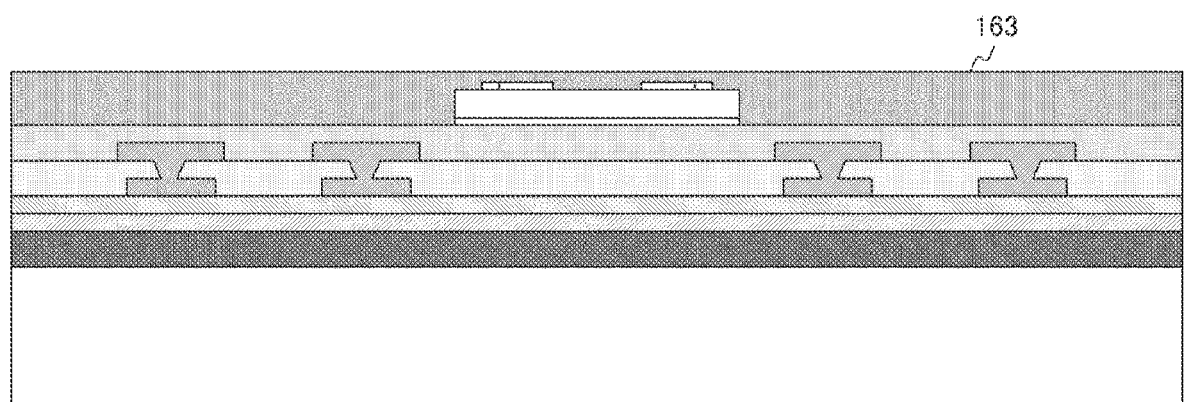
Figure 11:
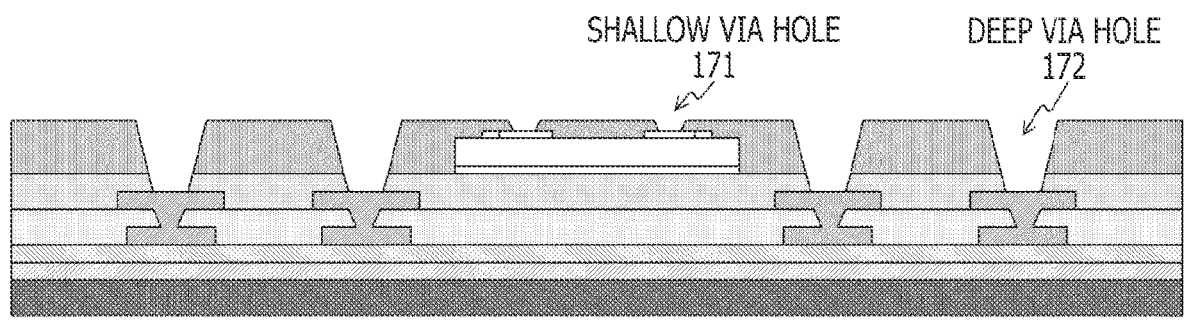

Then, as illustrated in j of FIG. 11, the interlayer insulating resin 163 is thermocompression bonded by roll laminating or laminating press.

Figure 12:
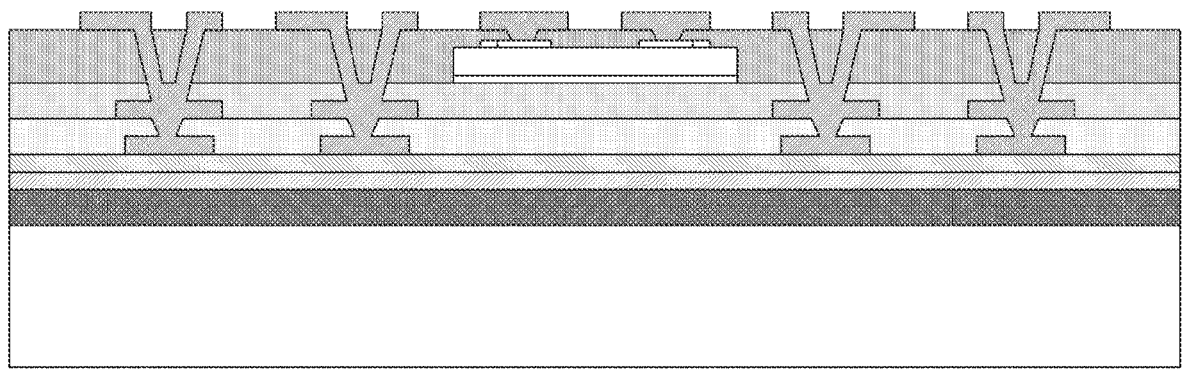
FIG. 12 depicts fourth diagrams each illustrating an example of the manufacturing process of the substrate 100 according to the embodiment of the present technique.
Figure 12:
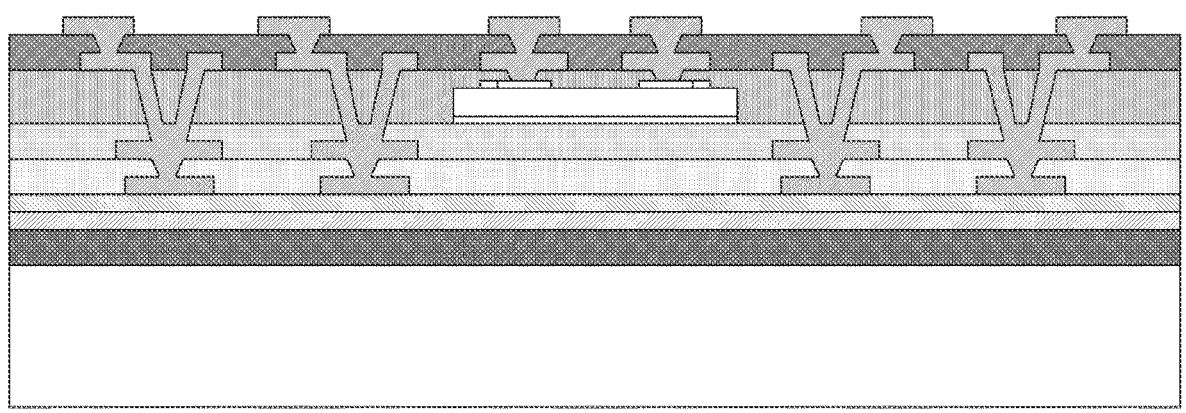
Figure 12:
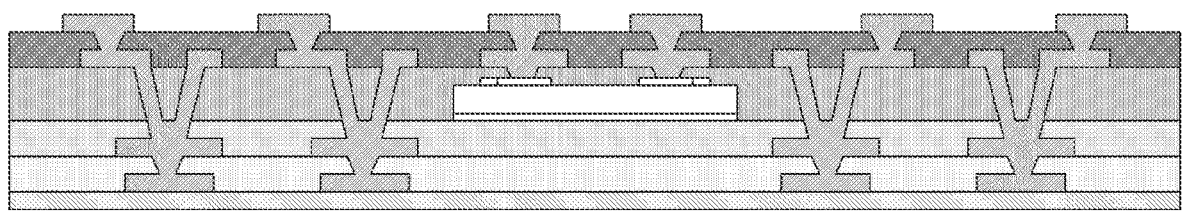

Next, as illustrated in k of FIG. 11 and l of FIG. 12, the via hole processing, the desmear treatment, the roughening treatment, the electroless plating treatment, and the electrolytic plating treatment similar to the above are performed. It should be noted that processing of a shallow via hole 171 for the copper land of the laser driver 200 and processing of a deep via hole 172 located one layer below, the desmear treatment, and the roughening treatment are performed simultaneously.

Here, the shallow via hole 171 is a filled via filled with copper plating. Each of the size and depth of the via is approximately 20 to 30 micrometers. In addition, the size of the diameter of the land is approximately 60 to 80 micrometers.

On the other hand, the deep via hole 172 is what is generally called a conformal via in which copper plating is applied only to the outside of the via. Each of the size and depth of the via is approximately 80 to 150 micrometers. In addition, the size of the diameter of the land is approximately 150 to 200 micrometers. It should be noted that it is desirable that the deep via hole 172 be arranged via an insulating resin of approximately 100 micrometers from the outer shape of the laser driver 200.

Next, as illustrated in m of FIG. 12, the interlayer insulating resin similar to the above is thermocompression bonded by roll laminating or laminating press. At this time, the inside of the conformal via is filled with the interlayer insulating resin. Then, the via hole processing, the desmear treatment, the roughening treatment, the electroless plating treatment, and the electrolytic plating treatment similar to the above are performed.

Subsequently, as illustrated in n of FIG. 12, the support plate 110 is separated by being peeled off from the interface between the carrier copper foil 131 and the ultra-thin copper foil 132 of the peelable copper foil 130.

Figure 13:
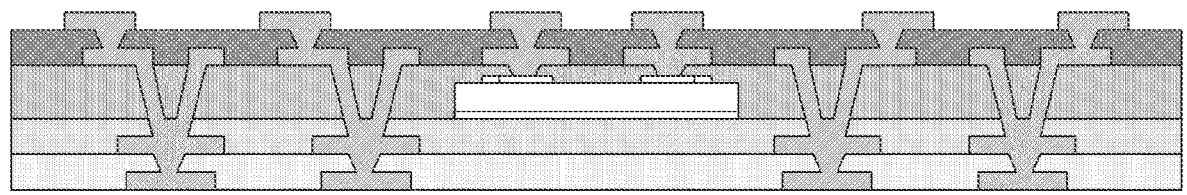
FIG. 13 depicts fifth diagrams each illustrating an example of the manufacturing process of the substrate 100 according to the embodiment of the present technique.
Figure 13:
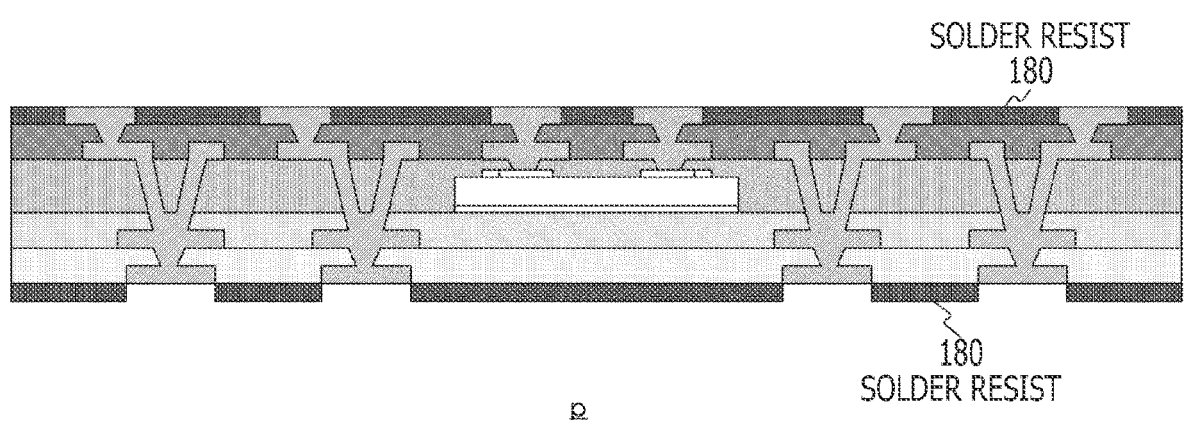
Figure 13:
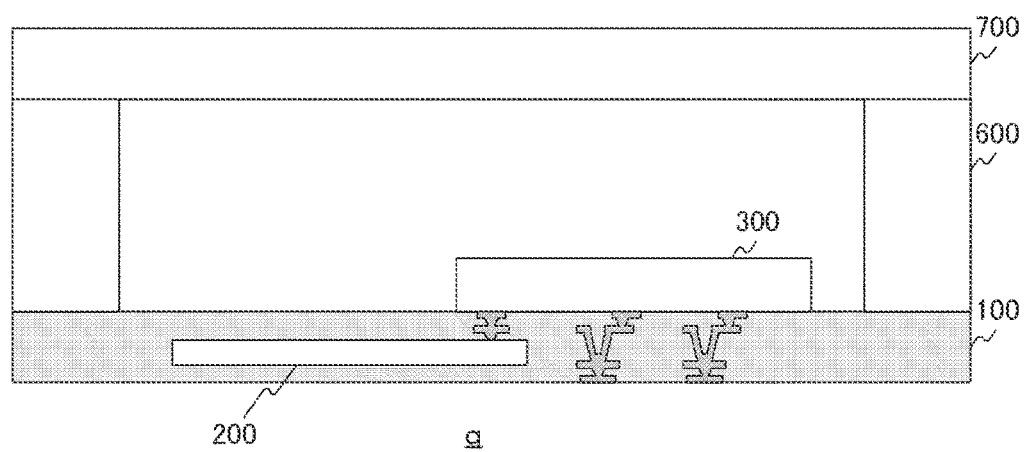

Then, as illustrated in o of FIG. 13, by removing the ultra-thin copper foil 132 and the plating base conductive layer with use of sulfuric acid-hydrogen peroxide-based soft etching, it is possible to obtain a component-incorporated substrate with the wiring pattern exposed.

Next, as illustrated in p of FIG. 13, a solder resist 180 of a pattern having an opening at the land portion of the wiring pattern is printed on the exposed wiring pattern. It should be noted that the solder resist 180 can be formed by a roll coater with use of a film type. Then, an electroless Ni plating of 3 micrometers or more is formed at the land portion of the opening of the solder resist 180, and an electroless Au plating of 0.03 micrometers or more is formed thereon. The electroless Au plating may be formed by one micrometer or more. Further, solder can be precoated thereon. Alternatively, an electrolytic Ni plating of 3 micrometers or more may be formed at the opening of the solder resist 180, and an electrolytic Au plating of 0.5 micrometers or more may be formed thereon. Further, other than the metal plating, an organic rust preventive film may be formed at the opening of the solder resist 180.

In addition, a BGA (Ball Grid Array) of solder balls may be mounted on the land for external connection by printing and applying cream solder as a connection terminal. In addition, as the connection terminal, a copper core ball, a copper pillar bump, a land grid array (LGA), or the like may be used.

The semiconductor laser 300, the photodiode 400, and the passive component 500 are mounted on the surface of the substrate 100 thus manufactured as described above, and the side walls 600 and the diffusion plate 700 are attached thereto, as illustrated in q of FIG. 12. In general, after performing the processing in the form of an aggregate substrate, the outer shape is processed by a dicer or the like to be separated into individual pieces.

It should be noted that, although the example of using the peelable copper foil 130 and the support plate 110 has been described in the above process, a copper clad laminate (CCL) can be used instead. In addition, as the manufacturing method of incorporating the component into the substrate, a method of forming a cavity in the substrate and mounting the same may be used.

Next, a manufacturing process performed between p and q in FIG. 13 will be described in more detail.

Figure 14:
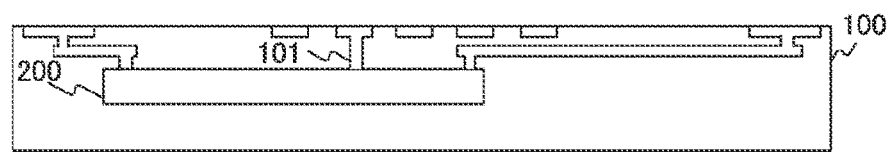
FIG. 14 depicts diagrams each illustrating an example of a manufacturing process viewed from the Y axis in the embodiment of the present technique.
Figure 14:
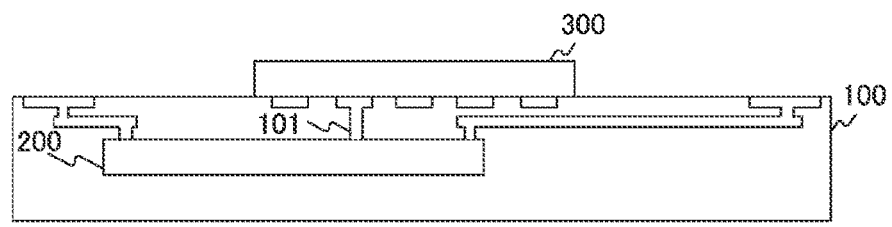

FIG. 14 depicts diagrams each illustrating an example of a manufacturing process up to the arrangement of the diffusion plate 700 in the embodiment of the present technique. In FIG. 14, a illustrates an example of a manufacturing process of the substrate 100, and b illustrates an example of a process of mounting the semiconductor laser 300.

As exemplified in a of FIG. 14, the substrate 100 incorporating the laser driver 200 is manufactured. The substrate 100 is manufactured by the respective processes from FIG. 7 to p in FIG. 13. Then, as exemplified in b of FIG. 14, the semiconductor laser 300 is mounted on the surface of the substrate 100.

Figure 15:
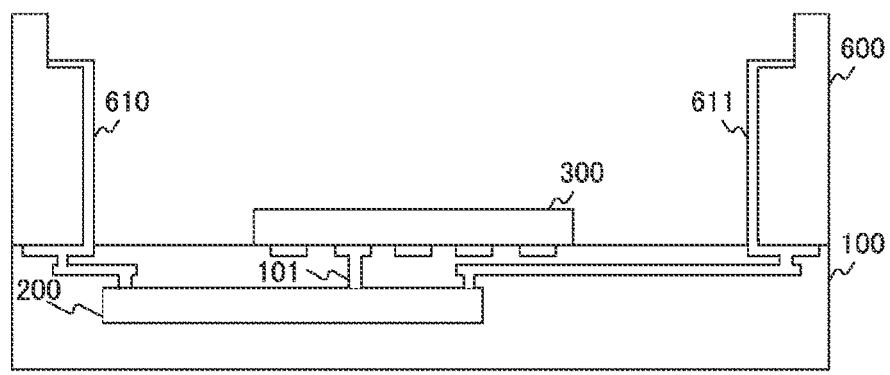
FIG. 15 depicts diagrams each illustrating an example of a manufacturing process up to the arrangement of a diffusion plate in the embodiment of the present technique.
Figure 15:
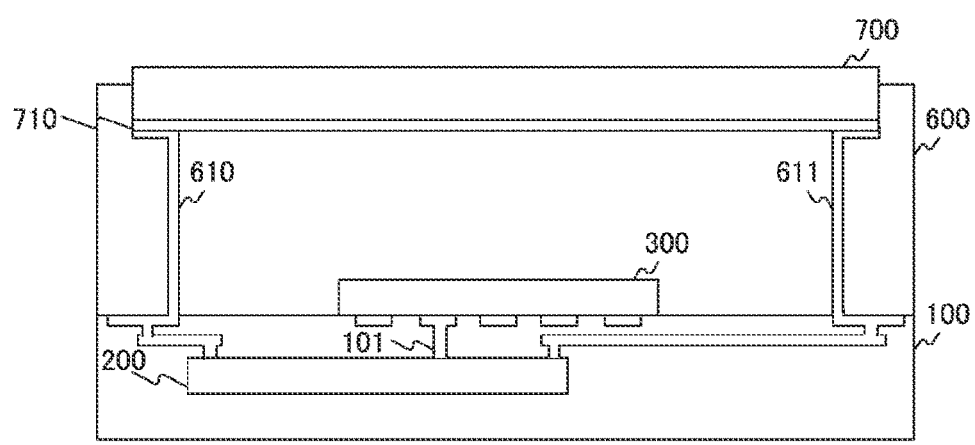

FIG. 15 depicts diagrams each illustrating an example of a manufacturing process up to the arrangement of the diffusion plate 700 in the embodiment of the present technique. In FIG. 15, a illustrates an example of a process of forming the side walls 600 together with the connection wiring 610 and the like, and b illustrates an example of a process of arranging the diffusion plate 700.

As exemplified in a of FIG. 15, the side walls 600 on which the patterns of the connection wiring 610 and the connection wiring 611 are formed are injection molded. Then, the conductive film 710 is formed on the lower surface of the diffusion plate 700, and the diffusion plate 700 is connected to upper portions of the side walls 600 as exemplified in b of FIG. 15.

As described above, according to the embodiment of the present technique, since the laser driver 200 irradiates laser light on the basis of the electric characteristic value of the conductive film 710 formed on the diffusion plate 700, the irradiation of the laser light can be stopped when the diffusion plate 700 is damaged or the like. Accordingly, the laser light can be prevented from being output without being diffused, and the safety of the semiconductor laser driving apparatus 10 can be improved.

FIRST MODIFIED EXAMPLE

In the above-described embodiment, the connection wiring 610 and the like formed on the inner walls of the side walls 600 electrically connect the conductive film 710 and the laser driver 200 to each other, but the conductive film 710 and the laser driver 200 can also be connected to each other via through vias penetrating the side walls. A semiconductor laser driving apparatus 10 according to a first modified example of the embodiment is different from that of the embodiment in that electrical connection is made via the through vias.

Figure 16:
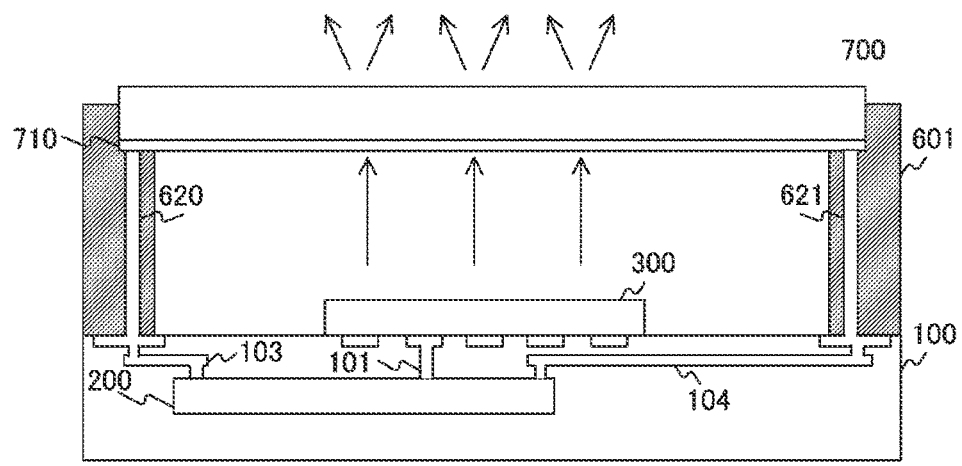
FIG. 16 is a diagram for illustrating an example of a cross-sectional view of a semiconductor laser driving apparatus 10 according to a first modified example of the embodiment of the present technique.

FIG. 16 is a diagram for illustrating an example of a cross-sectional view of the semiconductor laser driving apparatus 10 according to the first modified example of the embodiment of the present technique. In the semiconductor laser driving apparatus 10 according to the first modified example of the embodiment, side walls 601 are formed in place of the side walls 600. Ceramic is used as a material of the side walls 601.

In addition, through vias 620 and 621 penetrating the side walls 601 along the Z axis direction are provided in place of the connection wiring 610 and the connection wiring 611. The through via 620 electrically connects the conductive film 710 and the laser driver 200 to each other via the wiring 103. The through via 621 electrically connects the conductive film 710 and the laser driver 200 to each other via the wiring 104.

As described above, in the first modified example of the embodiment of the present technique, the through vias 620 and 621 penetrating the side walls 601 electrically connect the conductive film 710 and the laser driver 200 to each other, and thus the formation of the wiring of the MID can be omitted.

SECOND MODIFIED EXAMPLE

In the above-described first modified example of the embodiment, the ceramic side walls 601 are used, but the material of the side walls is not limited to ceramic and may be a resin mold. A semiconductor laser driving apparatus 10 according to a second modified example of the embodiment is different from that of the first modified example in that the side walls are formed by using a resin mold.

Figure 17:
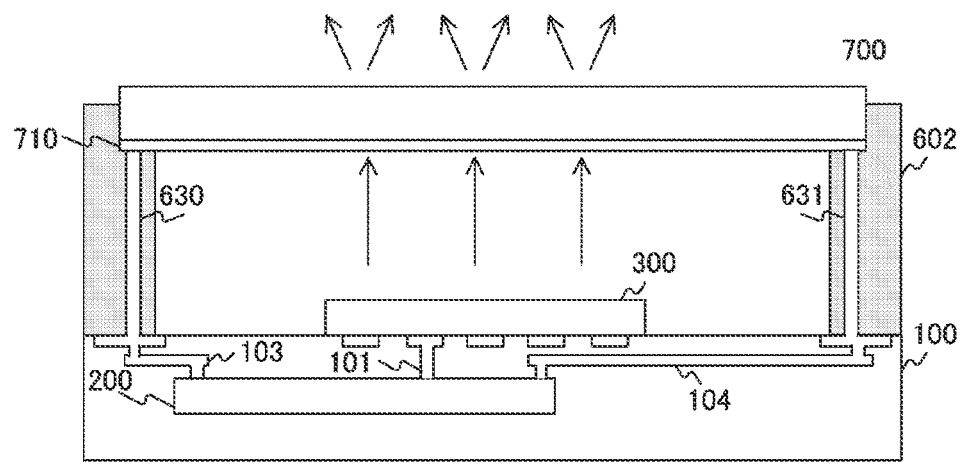
FIG. 17 is a diagram for illustrating an example of a cross-sectional view of a semiconductor laser driving apparatus 10 according to a second modified example of the embodiment of the present technique.

FIG. 17 is a diagram for illustrating an example of a cross-sectional view of the semiconductor laser driving apparatus 10 according to the first modified example of the embodiment of the present technique. In the semiconductor laser driving apparatus 10 according to the first modified example of the embodiment, side walls 602 are formed in place of the side walls 601. As a material of the side walls 601, a resin mold such as a thermoplastic resin is used.

In addition, TMVs (Through Mold Vias) 630 and 631 are provided in place of the through vias 620 and 621.

As described above, in the second modified example of the embodiment of the present technique, the side walls 602 are formed by using the resin mold to provide the TMVs 630 and 631, and thus the formation of the wiring of the MID can be omitted.

2. Application Example

Figure 18:
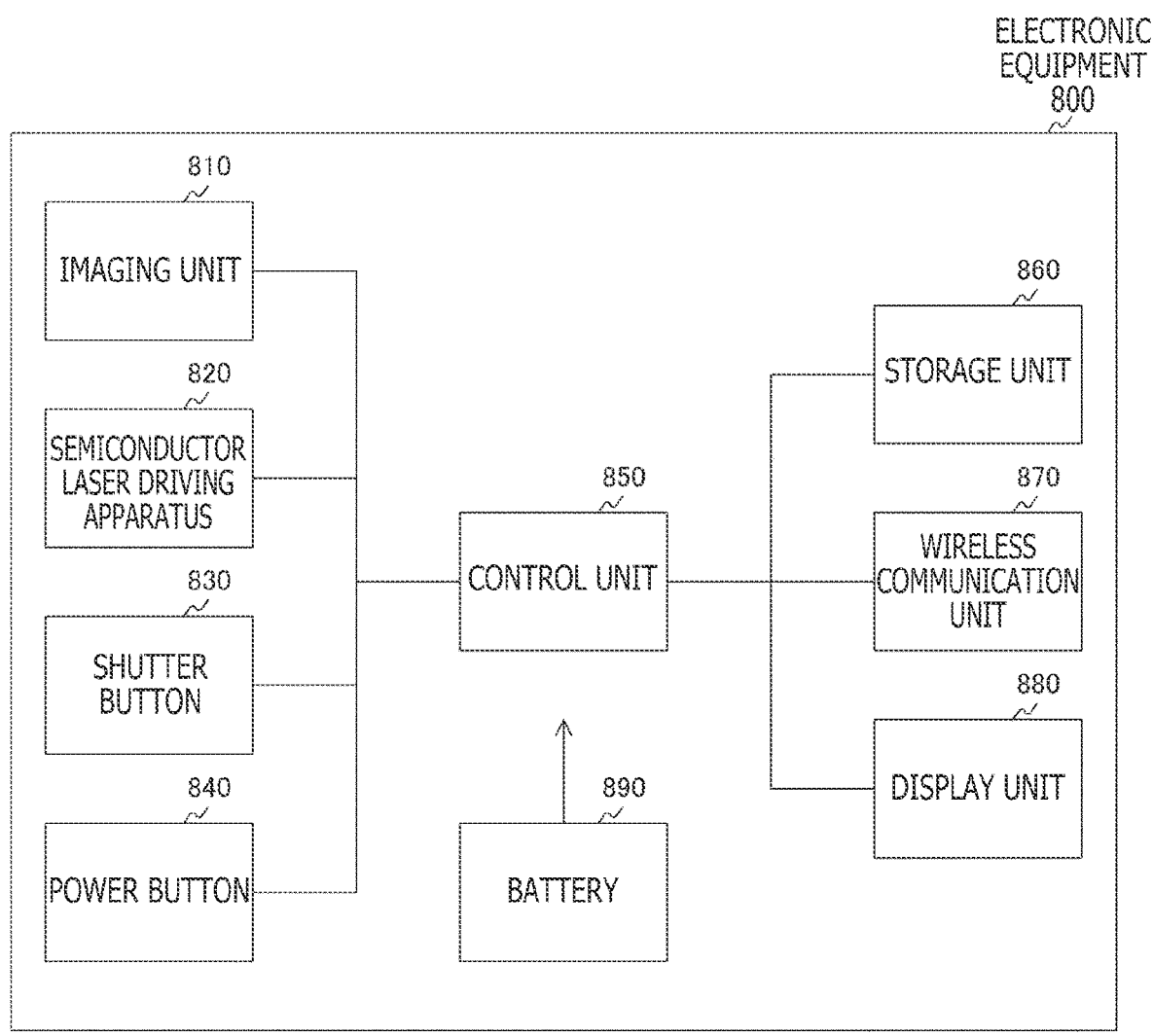
FIG. 18 is a diagram for illustrating a system configuration example of electronic equipment 800 as an application example of the embodiments of the present technique.

[Electronic Equipment]
FIG. 18 is a diagram for illustrating a system configuration example of electronic equipment 800 as an application example of the embodiments of the present technique.

The electronic equipment 800 is a portable terminal in which the semiconductor laser driving apparatus 10 according to the above-described embodiments is mounted. The electronic equipment 800 includes an imaging unit 810, a semiconductor laser driving apparatus 820, a shutter button 830, a power button 840, a control unit 850, a storage unit 860, a wireless communication unit 870, a display unit 880, and a battery 890.

The imaging unit 810 is an image sensor for imaging a subject. The semiconductor laser driving apparatus 820 is the semiconductor laser driving apparatus 10 according to the above-described embodiments.

The shutter button 830 is a button for giving an instruction on an imaging timing in the imaging unit 810 from the outside of the electronic equipment 800. The power button 840 is a button for giving an instruction on on/off of the power of the electronic equipment 800 from the outside of the electronic equipment 800.

The control unit 850 is a processing unit that controls the entire electronic equipment 800. The storage unit 860 is a memory for storing data and programs necessary for the operation of the electronic equipment 800. The wireless communication unit 870 performs wireless communication with the outside of the electronic equipment 800. The display unit 880 is a display for displaying an image or the like. The battery 890 is a power supply source for supplying power to each unit of the electronic equipment 800.

The imaging unit 810 detects the light receiving amount from 0 to 180 degrees as Q1 and detects the light receiving amount from 180 to 360 degrees as Q2 with a specific phase (for example, rising timing) of a light emission control signal for controlling the semiconductor laser driving apparatus 820 defined as 0 degree. In addition, the imaging unit 810 detects the light receiving amount from 90 to 270 degrees as Q3 and detects the light receiving amount from 270 to 90 degrees as Q4. The control unit 850 computes a distance d to an object by the following equation on the basis of these light receiving amounts Q1 to Q4, and displays the distance d on the display unit 880.

$$d = (c/4\pi f) \times \arctan\{(Q3-Q4)/(Q1-Q2)\}$$

The unit of the distance d in the above equation is, for example, meters (m). In the equation, c is the speed of light, and the unit thereof is, for example, meters per second (m/s). In the equation, arctan is the inverse function of a tangent function. The value of "(Q3−Q4)/(Q1−Q2)" indicates a phase difference between the irradiated light and the reflected light. In the equation, n indicates the ratio of the circumference of a circle to its diameter. In addition, f is the frequency of the irradiated light, and the unit thereof is, for example, megahertz (MHz).

Figure 19:
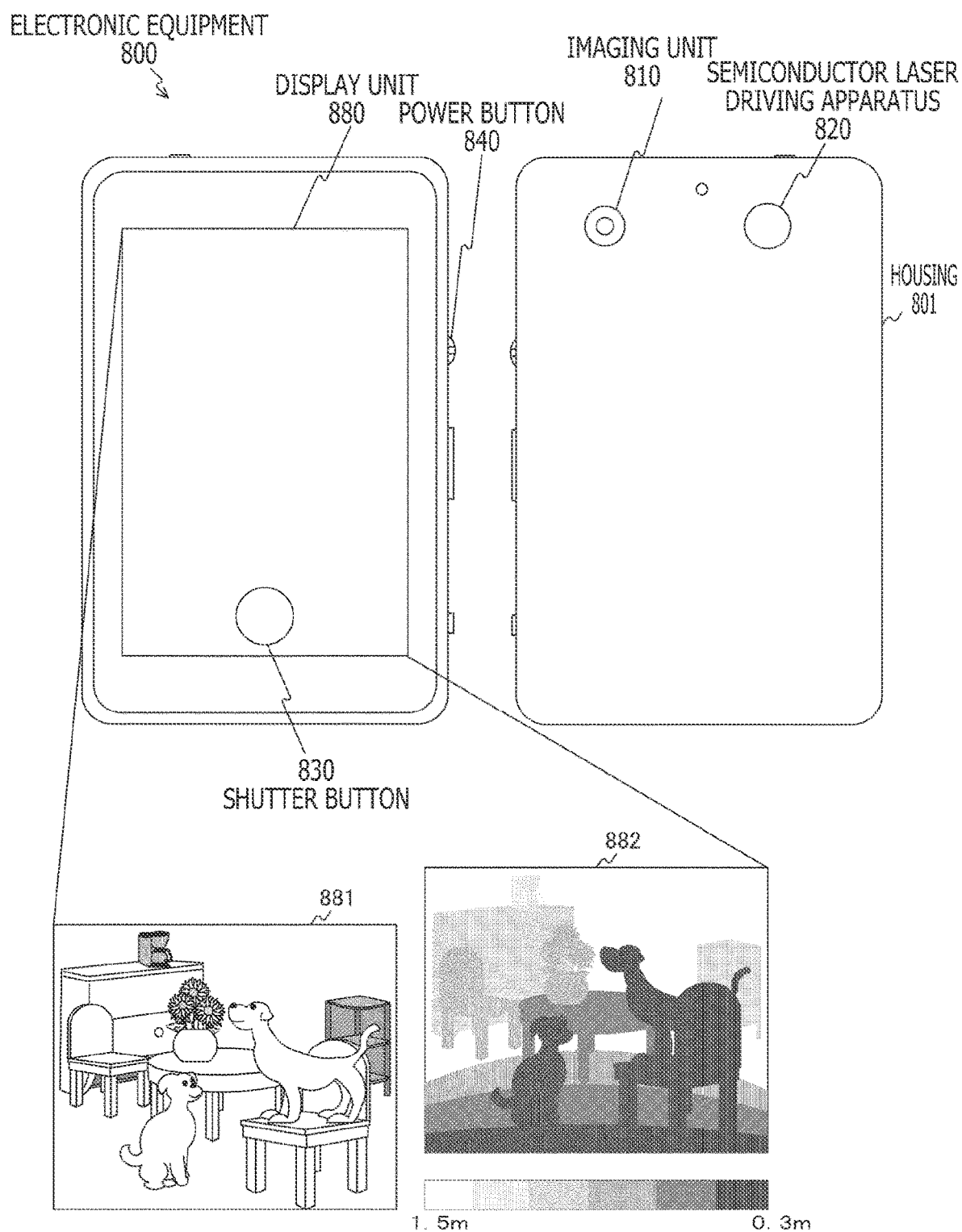
FIG. 19 is a diagram for illustrating an external configuration example of the electronic equipment 800 as an application example of the embodiments of the present technique.

FIG. 19 is a diagram for illustrating an external configuration example of the electronic equipment 800 as an application example of the embodiments of the present technique.

The electronic equipment 800 is housed in a housing 801, includes the power button 840 on a side surface, and includes the display unit 880 and the shutter button 830 on the front surface. In addition, optical regions of the imaging unit 810 and the semiconductor laser driving apparatus 820 are provided on the rear surface.

Accordingly, the display unit 880 can display not only a normal captured image 881 but also a depth image 882 according to the distance measurement result using ToF.

It should be noted that, in the application example, a portable terminal such as a smartphone is exemplified as the electronic equipment 800, but the electronic equipment 800 is not limited thereto, and may be, for example, a digital camera, a game machine, wearable equipment, or the like.

It should be noted that the above-described embodiments illustrate an example for embodying the present technique, and the matters in the embodiments have corresponding relations with the matters specifying the invention in the claims. Similarly, the matters specifying the invention in the claims have corresponding relations with the matters in the embodiments of the present technique to which the same names are given. However, the present technique is not limited to the embodiments, and can be embodied by applying various modifications to the embodiments without departing from the gist thereof.

It should be noted that the effects described in the specification are merely illustrative and not limitative, and other effects may be provided.

It should be noted that the present technique can also be configured as follows.

(1) A semiconductor laser driving apparatus including:

a substrate incorporating a laser driver;

a semiconductor laser mounted on one surface of the substrate;

connection wiring that electrically connects the laser driver and the semiconductor laser to each other with a wiring inductance of 0.5 nanohenries or less;

a diffusion plate that diffuses laser light irradiated by the semiconductor laser; and a transparent conductive film formed on a predetermined surface of the diffusion plate, in which the laser driver drives the semiconductor laser to irradiate the laser light on the basis of an electric characteristic value of the conductive film.

(2) The semiconductor laser driving apparatus according to (1), further including:

outer walls surrounding a region including the semiconductor laser on the one surface of the substrate, in which the diffusion plate covers an upside of the region surrounded by the outer walls.

(3) The semiconductor laser driving apparatus according to (2), further including:

wiring for connecting the conductive film and the laser driver to each other along the outer walls.

(4) The semiconductor laser driving apparatus according to (2), in which the outer walls include ceramic and a through via that penetrates the ceramic to connect the conductive film and the laser driver to each other.

(5) The semiconductor laser driving apparatus according to (2), in which the outer walls include a resin mold and a through via that penetrates the resin mold to connect the conductive film and the laser driver to each other.

(6) The semiconductor laser driving apparatus according to any one of (1) to (5), in which the electric characteristic value includes resistivity, and the laser driver irradiates the laser light in a case where the resistivity is less than a predetermined threshold value.

(7) The semiconductor laser driving apparatus according to any one of (1) to (6), in which the connection wiring has a length of 0.5 millimeters or less.

(8) The semiconductor laser driving apparatus according to any one of (1) to (7), in which the connection wiring is provided via a connection via provided in the substrate.

(9) The semiconductor laser driving apparatus according to any one of (1) to (8), in which the semiconductor laser is arranged in such a manner that a part thereof overlaps an upper part of the laser driver.

(10) The semiconductor laser driving apparatus according to (9), in which the semiconductor laser is arranged in such a manner that a part corresponding to 50% or less of an area thereof overlaps the upper part of the laser driver.

(11) The semiconductor laser driving apparatus according to any one of (1) to (10), in which the substrate includes a thermal via at a position where the semiconductor laser is mounted.

(12) The semiconductor laser driving apparatus according to any one of (1) to (11), further including:

a photodiode that is mounted on the one surface of the substrate to monitor light intensity of the laser light irradiated from the semiconductor laser.

(13) The semiconductor laser driving apparatus according to any one of (1) to (12), further including:

a connection terminal for establishing connection with an outside on a surface opposite to the one surface of the substrate.

(14) The semiconductor laser driving apparatus according to (13), in which the connection terminal is formed by using at least any one of a solder ball, a copper core ball, a copper pillar bump, and a land grid array.

(15) Electronic equipment including:

a substrate incorporating a laser driver;

a semiconductor laser mounted on one surface of the substrate;

connection wiring that electrically connects the laser driver and the semiconductor laser to each other with a wiring inductance of 0.5 nanohenries or less;

a diffusion plate that diffuses laser light irradiated by the semiconductor laser; and a transparent conductive film formed on a predetermined surface of the diffusion plate, in which the laser driver drives the semiconductor laser to irradiate the laser light on the basis of an electric characteristic value of the conductive film.

(16) A manufacturing method of a semiconductor laser driving apparatus, including:

a step of forming a laser driver on an upper surface of a support plate;

a step of forming a substrate incorporating the laser driver, by forming connection wiring of the laser driver;

a step of mounting a semiconductor laser on one surface of the substrate and forming connection wiring that electrically connects the laser driver and the semiconductor laser to each other via the connection wiring with a wiring inductance of 0.5 nanohenries or less;

a step of providing outer walls surrounding a region including the semiconductor laser on the one surface of the substrate; and a step of forming a transparent conductive film on a predetermined surface of a diffusion plate for diffusing laser light irradiated by the semiconductor laser, to connect the transparent conductive film to the outer walls.

REFERENCE SIGNS LIST 10, 820: Semiconductor laser driving apparatus
100: Substrate
101: Connection via
102: Thermal via
103, 104: Wiring
110: Support plate
120: Adhesive resin layer
130: Peelable copper foil
131: Carrier copper foil
132: Ultra-thin copper foil
140, 180: Solder resist
150: Wiring pattern
161 to 163: Interlayer insulating resin
170 to 172: Via hole
200: Laser driver
210: I/O pad
220: Protective insulating layer
230: Surface protective film
240: Adhesion layer/seed layer
250: Photoresist
260: Copper land and copper redistribution layer (RDL)
290: Die attach film (DAF)
300: Semiconductor laser
400: Photodiode
500: Passive component
600 to 602: Side wall
610, 611: Connection wiring
620, 621: Through via
630, 631: TMV (Through Mold Via)
700: Diffusion plate
710: Conductive film
800: Electronic equipment
801: Housing
810: Imaging unit
830: Shutter button
840: Power button
850: Control unit
860: Storage unit
870: Wireless communication unit
880: Display unit
890: Battery

What is claimed is:

1. A semiconductor laser driving apparatus, comprising:
a substrate incorporating a laser driver;
a semiconductor laser mounted on one surface of the substrate;
connection wiring that electrically connects the laser driver and the semiconductor laser to each other with a wiring inductance of 0.5 nanohenries or less;
a diffusion plate that diffuses laser light irradiated by the semiconductor laser; and
a transparent conductive film formed on a predetermined surface of the diffusion plate,
wherein the laser driver drives the semiconductor laser to irradiate the laser light on a basis of an electric characteristic value of the transparent conductive film.

2. The semiconductor laser driving apparatus according to claim 1, further comprising:
outer walls surrounding a region including the semiconductor laser on the one surface of the substrate,
wherein the diffusion plate covers an upside of the region surrounded by the outer walls.

3. The semiconductor laser driving apparatus according to claim 2, further comprising:
wiring for connecting the transparent conductive film and the laser driver to each other along the outer walls.

4. The semiconductor laser driving apparatus according to claim 2,
wherein the outer walls include ceramic and a through via that penetrates the ceramic to connect the transparent conductive film and the laser driver to each other.

5. The semiconductor laser driving apparatus according to claim 2,
wherein the outer walls include a resin mold and a through via that penetrates the resin mold to connect the transparent conductive film and the laser driver to each other.

6. The semiconductor laser driving apparatus according to claim 1,
wherein the electric characteristic value includes resistivity, and
the laser driver irradiates the laser light in a case where the resistivity is less than a predetermined threshold value.

7. The semiconductor laser driving apparatus according to claim 1,
wherein the connection wiring has a length of 0.5 millimeters or less.

8. The semiconductor laser driving apparatus according to claim 1,
wherein the connection wiring is provided via a connection via provided in the substrate.

9. The semiconductor laser driving apparatus according to claim 1,
wherein the semiconductor laser is arranged in such a manner that a part thereof overlaps an upper part of the laser driver.

10. The semiconductor laser driving apparatus according to claim 9,
wherein the semiconductor laser is arranged in such a manner that a part corresponding to 50% or less of an area thereof overlaps the upper part of the laser driver.

11. The semiconductor laser driving apparatus according to claim 1,
wherein the substrate includes a thermal via at a position where the semiconductor laser is mounted.

12. The semiconductor laser driving apparatus according to claim 1, further comprising:
a photodiode that is mounted on the one surface of the substrate to monitor light intensity of the laser light irradiated from the semiconductor laser.

13. The semiconductor laser driving apparatus according to claim 1, further comprising:
a connection terminal for establishing a connection with an outside on a surface opposite to the one surface of the substrate.

14. The semiconductor laser driving apparatus according to claim 13,
wherein the connection terminal is formed by using at least any one of a solder ball, a copper core ball, a copper pillar bump, and a land grid array.

15. Electronic equipment, comprising:
a substrate incorporating a laser driver;
a semiconductor laser mounted on one surface of the substrate;
connection wiring that electrically connects the laser driver and the semiconductor laser to each other with a wiring inductance of 0.5 nanohenries or less;
a diffusion plate that diffuses laser light irradiated by the semiconductor laser; and
a transparent conductive film formed on a predetermined surface of the diffusion plate,
wherein the laser driver drives the semiconductor laser to irradiate the laser light on a basis of an electric characteristic value of the transparent conductive film.

16. A manufacturing method of a semiconductor laser driving apparatus, comprising:
a step of forming a laser driver on an upper surface of a support plate;
a step of forming a substrate incorporating the laser driver, by forming connection wiring of the laser driver;
a step of mounting a semiconductor laser on one surface of the substrate and forming connection wiring that electrically connects the laser driver and the semiconductor laser to each other via the connection wiring with a wiring inductance of 0.5 nanohenries or less;
a step of providing outer walls surrounding a region including the semiconductor laser on the one surface of the substrate; and
a step of forming a transparent conductive film on a predetermined surface of a diffusion plate for diffusing laser light irradiated by the semiconductor laser, to connect the transparent conductive film to the outer walls.

* * * * *